(12) United States Patent
Li et al.

(10) Patent No.: US 12,507,425 B2
(45) Date of Patent: Dec. 23, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Juncai Li, Hefei (CN); Bo Yang, Hefei (CN); Xiaoyu Yang, Hefei (CN); Kai Cao, Hefei (CN); Gongyi Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 438 days.

(21) Appl. No.: 18/149,197

(22) Filed: Jan. 3, 2023

(65) Prior Publication Data
US 2023/0231005 A1    Jul. 20, 2023

(30) Foreign Application Priority Data
Jan. 18, 2022    (CN) .......................... 202210054443.3

(51) Int. Cl.
| | | |
|---|---|---|
| H01L 21/822 | (2006.01) | |
| H01L 23/528 | (2006.01) | |
| H01L 29/16 | (2006.01) | |
| H01L 49/02 | (2006.01) | |
| H10D 1/00 | (2025.01) | |
| H10D 1/68 | (2025.01) | |

(52) U.S. Cl.
CPC ............. H10D 1/042 (2025.01); H10D 1/716 (2025.01)

(58) Field of Classification Search
CPC ...... H10D 1/716; H10D 1/043; H10B 12/033; H10B 12/318; H01L 21/31116; H01L 21/31144; H01L 21/76805; H01L 21/76804
See application file for complete search history.

(56) References Cited

U.S. PATENT DOCUMENTS

| | | | | |
|---|---|---|---|---|
| 2014/0065785 A1* | 3/2014 | Yoon | ...................... | H10D 1/692 438/381 |
| 2015/0079798 A1* | 3/2015 | Ling | ................. | H01L 21/76826 438/714 |
| 2020/0194437 A1* | 6/2020 | Song | ...................... | H10D 64/20 |

FOREIGN PATENT DOCUMENTS

CN           208336219 U      1/2019

* cited by examiner

*Primary Examiner* — John A Bodnar
(74) *Attorney, Agent, or Firm* — Kilpatrick Townsend & Stockton LLP

(57) ABSTRACT

The present disclosure provides a method of manufacturing a semiconductor structure and a semiconductor structure. The method of manufacturing the semiconductor structure includes: providing an initial structure, where the initial structure includes a laminated structure and a plurality of capacitor holes formed in the laminated structure, and a bottom electrode is formed in each of the capacitor holes; forming a hard mask layer, where the hard mask layer covers a top surface of the initial structure; and partially etching the hard mask layer through an etching gas, to form a plurality of first opening, where the etching gas includes a first gas, and the first gas includes a nitrogen atomic-containing and/or hydrogen atomic-containing gas, to avoid a combination reaction between the first gas and a material of the bottom electrode.

13 Claims, 13 Drawing Sheets

METHOD OF MANUFACTURING SEMICONDUCTOR STRUCTURE AND SEMICONDUCTOR STRUCTURE

CROSS-REFERENCE TO RELATED APPLICATION

This application claims the priority of Chinese Patent Application No. 202210054443.3, submitted to the Chinese Intellectual Property Office on Jan. 18, 2022, the disclosure of which is incorporated herein in its entirety by reference.

TECHNICAL FIELD

The present disclosure relates to the technical field of semiconductors, and in particular, to a method of manufacturing a semiconductor structure and a semiconductor structure.

BACKGROUND

As one of the most important components in an integrated circuit, the capacitor is widely used in the memory chip. At present, the integrated circuits are developing to be miniaturized, which requires corresponding integrated circuits to have a higher integration density and a smaller critical dimension. The critical dimension of the capacitor is also reduced. In the manufacturing process of the capacitor, part of the bottom electrode material may be lost, affecting the electrical performance and yield of the capacitor.

SUMMARY

An overview of the subject described in detail in the present disclosure is provided below. This overview is not intended to limit the protection scope of the claims.

The present disclosure provides a method of manufacturing a semiconductor structure and a semiconductor structure.

A first aspect of the present disclosure provides a method of manufacturing a semiconductor structure. The method of manufacturing a semiconductor structure includes:

providing an initial structure, where the initial structure includes a laminated structure and a plurality of capacitor holes formed in the laminated structure, the capacitor hole penetrates the laminated structure, and a bottom electrode is formed in each of the capacitor holes;

forming a hard mask layer, where the hard mask layer covers a top surface of the initial structure; and partially etching the hard mask layer through an etching gas, to form a plurality of first openings in the hard mask layer, where each of the first openings exposes a partial top surface of the laminated structure and a partial top surface of at least one of the bottom electrodes;

where the etching gas includes a first gas, and the first gas comprises a nitrogen atomic-containing and/or hydrogen atomic-containing gas, to avoid a combination reaction between the first gas and a material of the bottom electrode.

A second aspect of the present disclosure provides a semiconductor structure. The semiconductor structure is manufactured by using the foregoing method of manufacturing a semiconductor structure.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
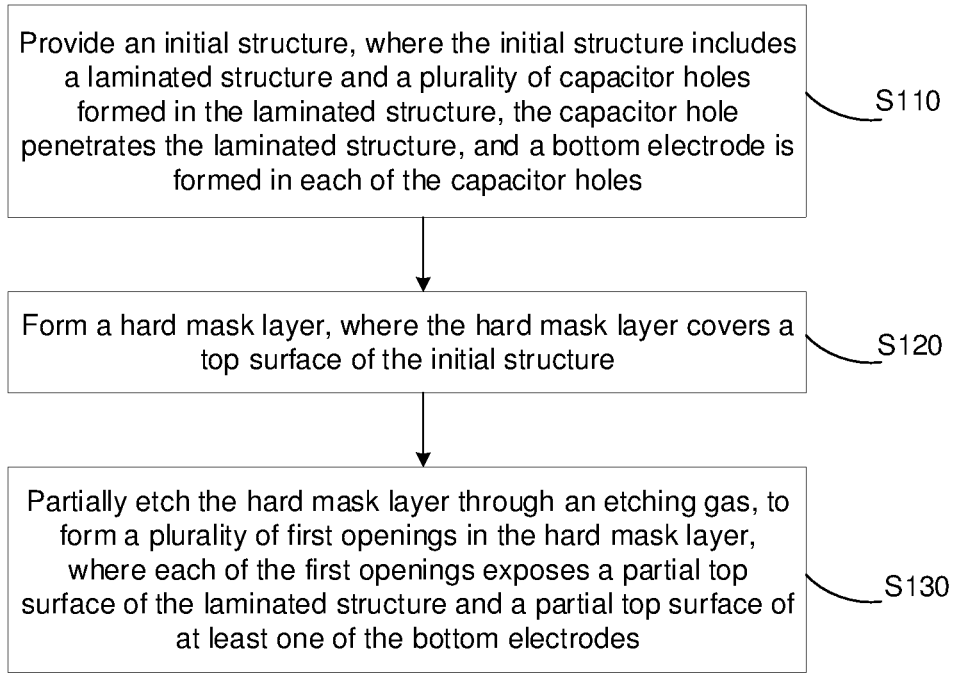
FIG. 1 is a flowchart of a method of manufacturing a semiconductor structure according to an exemplary embodiment.

An exemplary embodiment of the present disclosure provides a method of manufacturing a semiconductor structure, as shown in FIG. 1. FIG. 1 is a flowchart of a method of manufacturing a semiconductor structure according to an exemplary embodiment of the present disclosure. FIG. 7 to FIG. 29 are schematic diagrams of various stages of the method of manufacturing a semiconductor structure. The method of manufacturing a semiconductor structure is described below with reference to FIG. 7 to FIG. 29.

The semiconductor structure is not limited in this embodiment. The semiconductor structure is described below by taking a dynamic random access memory (DRAM) as an example, but this embodiment is not limited to this, and the semiconductor structure in this embodiment may further be another structure.

As shown in FIG. 1, an exemplary embodiment of the present disclosure provides a method of manufacturing a semiconductor structure, including the following steps:

Step S110: Provide an initial structure, where the initial structure includes a laminated structure and a plurality of capacitor holes formed in the laminated structure, the capacitor hole penetrates the laminated structure, and a bottom electrode is formed in each of the capacitor holes.

Figure 9:
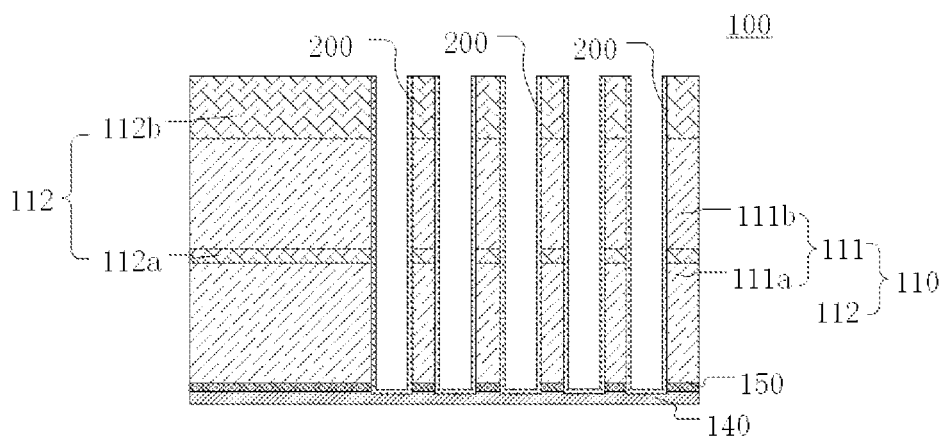
FIG. 9 is a schematic diagram of forming a bottom electrode according to an exemplary embodiment.

During implementation of this step, as shown in FIG. 9, the initial structure 100 includes a laminated structure 110. The laminated structure 110 includes a sacrificial layer 111 and a support layer 112 that are alternately arranged. The specific number of laminated layers and a lamination height of the sacrificial layers 111 and the support layers 112 in the laminated structure 110 are set according to the height of the bottom electrode 200. A plurality of independent capacitor holes 120 are formed in the laminated structure 110. A bottom electrode 200 is provided in each capacitor hole 120. A top surface of the bottom electrode 200 is flush with a top surface of the laminated structure 110.

The first sacrificial layer 111 is made of a material including silicon oxide or boro-phospho-silicate glass (BPSG). The material of the first sacrificial layer 111 may be doped with boron or phosphorus. The material of the support layer 112 includes any one or a combination of any two or more of silicon nitride, silicon oxynitride, or silicon carbon nitride.

Step S120: Form a hard mask layer, where the hard mask layer covers a top surface of the initial structure.

Figure 11:
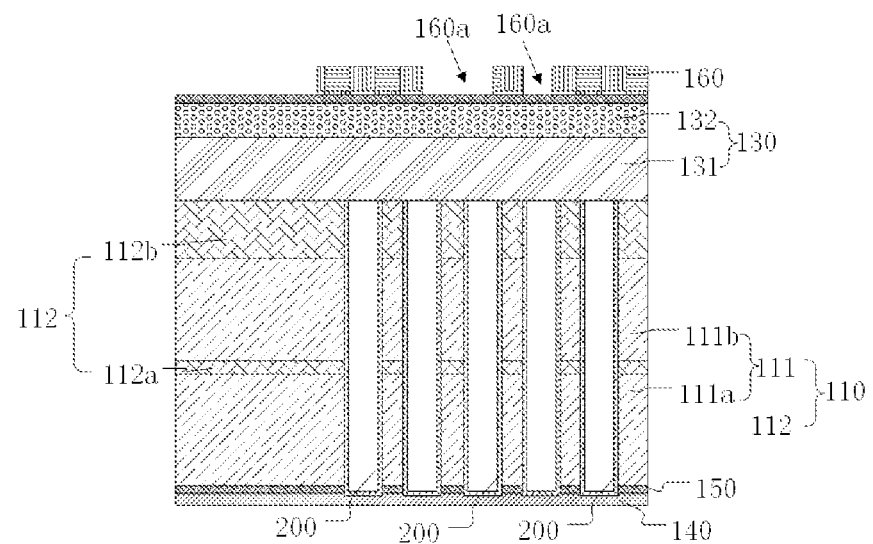
FIG. 11 is a schematic diagram of forming a hard mask layer according to an exemplary embodiment.

As shown in FIG. 11, the hard mask layer 130 includes a first material. Under a discharge condition, the first material reacts with plasma generated from a first gas through ionization, to generate a volatile substance. Neither the volatile substance nor the plasma generated from the first gas through ionization chemically reacts with the material of the bottom electrode 200. The hard mask layer 130 may be a single-layer or multi-layer structure. When the hard mask layer 130 is a multi-layer structure, at least one layer of the structure is made of the first material. For example, the first material may be crystalline carbon or amorphous carbon.

Step S130: Partially etch the hard mask layer through an etching gas, to form a plurality of first openings in the hard mask layer, where each of the first openings exposes a partial top surface of the laminated structure and a partial top surface of at least one of the bottom electrodes.

The etching gas includes the first gas, and the first gas includes a nitrogen atomic-containing and/or hydrogen atomic-containing gas, to avoid a combination reaction between the first gas and the material of the bottom electrode. For example, the first gas may include a nitrogen-hydrogen gas. For example, the first gas may include one or both of $NH_3$ and $N_2H_2$.

Figure 13:
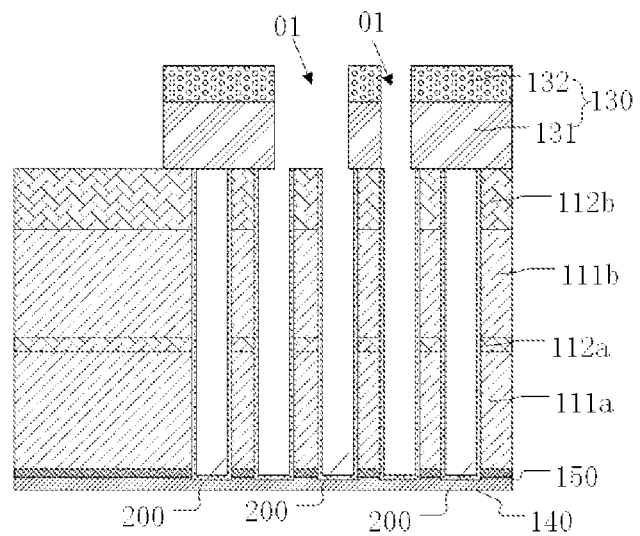
FIG. 13 is a schematic diagram of forming first openings according to an exemplary embodiment.

As shown in FIG. 13 with reference to FIG. 11, under the discharge condition, the hard mask layer 130 is etched by using the first gas, to form the first openings 01 on the hard mask layer 130. In the etching process, the first gas is ionized to generate nitrogen plasma or hydrogen plasma, and the first material in the hard mask layer 130 reacts with the nitrogen plasma or the hydrogen plasma to form an etching product, where the etching product includes carbon atoms, and also includes nitrogen atoms or hydrogen atoms, and the etching product is a volatile substance. The volatile substance escapes to the process environment. Neither of the volatile substance and the plasma generated from the first gas through ionization reacts with the material of the bottom electrode, which prevents the material of the bottom electrode from being polluted by the etching product. On the other hand, the volatile substance will evaporate immediately after being generated, and will not be stored in the bottom electrode, which avoids damaging the bottom electrode during subsequent supporting, thereby improving the capacitive storage capacity of the capacitor structure.

Figure 2:
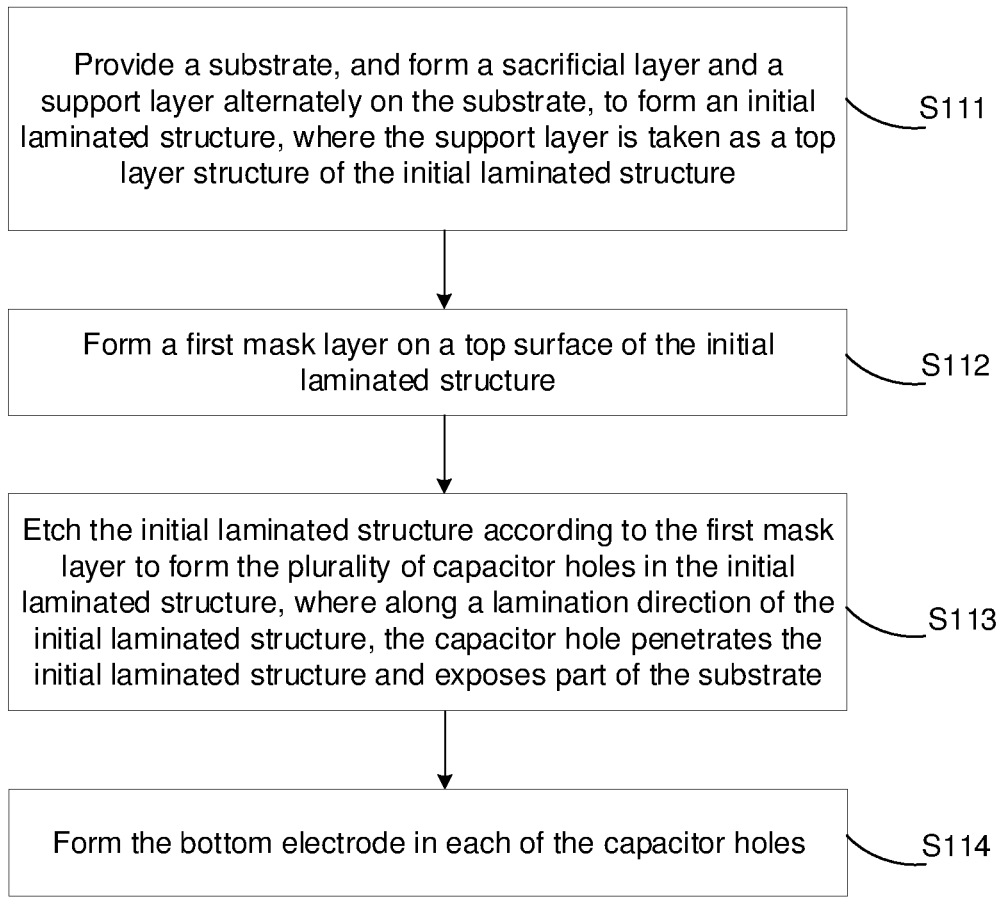
FIG. 2 is a flowchart of providing an initial structure according to an exemplary embodiment.

According to an exemplary embodiment, this embodiment is a description of the implementation of step S110. In the implementation process, as shown in FIG. 2, according to some embodiments of the present disclosure, the providing an initial structure includes the following steps:

Step S111: Provide a substrate, and form a sacrificial layer and a support layer alternately on the substrate, to form an initial laminated structure, where the support layer is taken as a top layer structure of the initial laminated structure.

Figure 7:
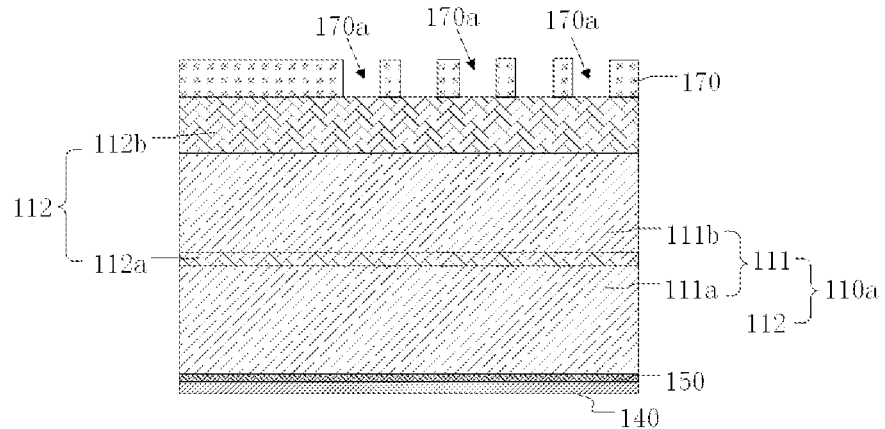
FIG. 7 is a schematic diagram of forming an initial laminated structure according to an exemplary embodiment.

As shown in FIG. 7, the substrate 140 is a semiconductor substrate, and includes a silicon-containing substance. The substrate 140 may include a silicon substrate, a silicon-germanium substrate or a silicon on insulator (SOI) substrate. In an example, an isolation layer 150 may be provided on a top surface of the substrate 140. The number of lamination layers and lamination thickness of the initial laminated structure 110a are set according to the height of the bottom electrode to be formed.

Step S112: Form a first mask layer on a top surface of the initial laminated structure.

As shown in FIG. 7, the first mask layer 170 includes a first mask pattern 170a, where the first mask pattern 170a exposes the top surface of part of the initial laminated structure 110a.

Step S113: Etch the initial laminated structure according to the first mask layer to form the plurality of capacitor holes in the initial laminated structure, where along a lamination direction of the initial laminated structure, the capacitor holes penetrate the initial laminated structure and expose part of the substrate.

Figure 8:
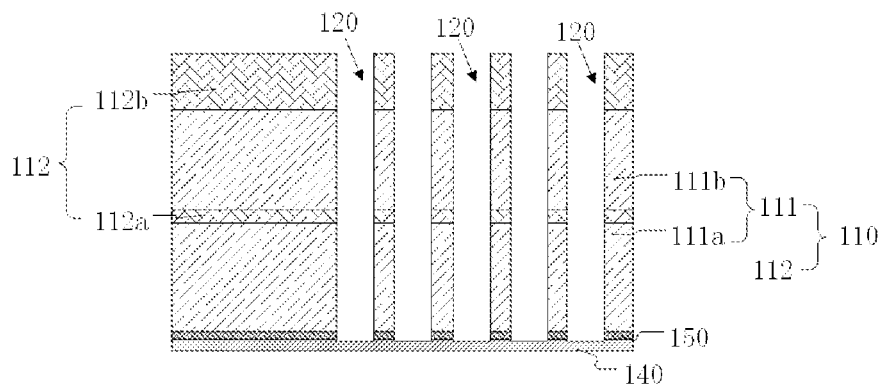
FIG. 8 is a schematic diagram of forming a plurality of capacitor holes according to an exemplary embodiment.

As shown in FIG. 8 with reference to FIG. 7, by using the first mask layer 170 as a mask, the support layer 112 and the sacrificial layer 111 exposed by the first mask pattern 170a are etched sequentially, to form the plurality of capacitor holes 120 penetrating the initial laminated structure 110a in the initial laminated structure 110a, where a retained initial laminated structure 110a forms the laminated structure 110.

Step S114: Form the bottom electrode in each of the capacitor holes.

As shown in FIG. 9, the bottom electrode 200 may be used to form a cup-type capacitor, and in other embodiments, the bottom electrode 200 may be used to form a columnar capacitor. As shown in FIG. 9, the bottom electrode 200 covers a side wall and a bottom surface of the capacitor hole 120. That is, along the lamination direction of the laminated structure 110, the bottom electrode 200 has a U-shaped cross section.

In some embodiments, referring to FIG. 9, forming the bottom electrode 200 in the capacitor hole 120 includes: depositing an electrode material, where the electrode material covers the side wall and the bottom surface of the capacitor hole 120, to form the bottom electrode 200.

The electrode material may be deposited through atomic layer deposition (ALD). The electrode material covers the side wall and bottom surface of the capacitor hole 120 as well as the top surface of the laminated structure 110. The electrode material covering the top surface of the laminated structure 110 is removed through back etching, and the retained electrode material forms the bottom electrode 200. The bottom electrode 200 covers the side wall and bottom surface of the capacitor hole 120.

The bottom electrode 200 is made of a material including a compound formed from one or both of a metal nitride and a metal silicide, such as titanium nitride, titanium silicide, nickel silicide, $TiSi_xN_y$, etc.

In the initial structure formed in this embodiment, the bottom electrode may be used to form a cup-type capacitor or a columnar capacitor. Thereby expanding the application range of the manufacturing method in this embodiment.

Figure 3:
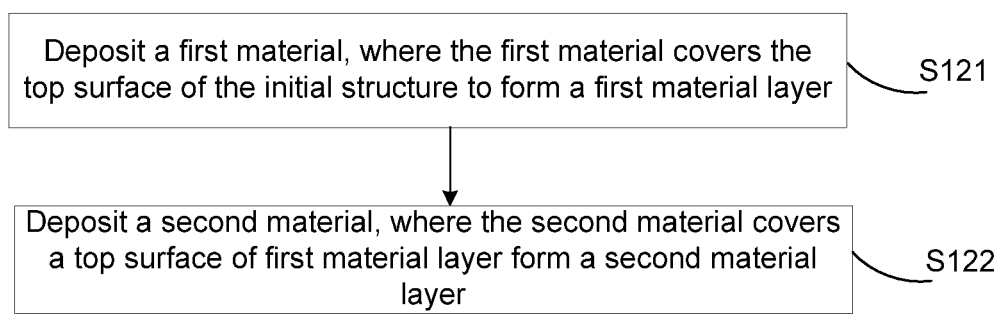
FIG. 3 is a flowchart of forming a hard mask layer according to an exemplary embodiment.

According to an exemplary embodiment, this embodiment is a description of the implementation of step S120. In the implementation process, as shown in FIG. 3, according to some embodiments of the present disclosure, the forming a hard mask layer includes the following steps:

Step S121: Deposit a first material, where the first material covers the top surface of the initial structure to form a first material layer.

Referring to FIG. 11, the first material is deposited through chemical vapor deposition (CVD) or physical vapor deposition (PVD), where the first material covers the top surface of the initial structure 100 to form the first material layer 131.

Under the discharge condition, the first material reacts with plasma generated from the first gas through ionization to generate a volatile substance. For example, the first material may be carbide. For example, the first material may be crystalline carbon, amorphous carbon, or the like.

Step S122: Deposit a second material, where the second material covers a top surface of first material layer form a second material layer.

Referring to FIG. 11, the second material is deposited through chemical vapor deposition (CVD) or physical vapor deposition (PVD), where the second material covers the top surface of the first material layer 131 to form the second material layer 132.

Under the discharge condition of the first gas, the first material has a higher etching selectivity relative to the second material. That is, under the discharge condition of the first gas, an etching speed of the first gas for the first material layer is much higher than that for the second material layer. In other words, when the first gas etches the first material layer, the second material layer is almost not etched by the first gas.

For example, the second material may be any material satisfying the foregoing etching selectivity. For example, the second material may be silicon nitride, silicon oxynitride or the like.

The hard mask layer formed in this embodiment is double-layer structure including the first material layer and the second material layer. Moreover, under the discharge condition, the first material has a higher etching selectivity relative to the second material, such that the second material layer is not damaged during etching of the first material layer, thereby ensuring high accuracy of the appearance and size of the first opening subsequently formed through etching.

Figure 4:
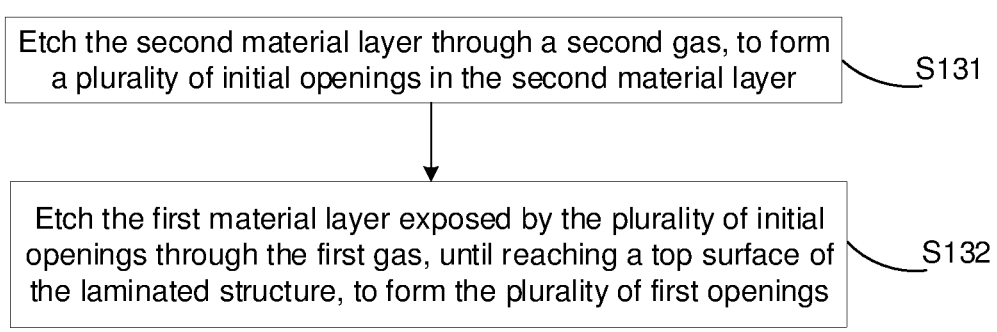
FIG. 4 is a flowchart of forming a plurality of first openings in a hard mask layer according to an exemplary embodiment.

According to an exemplary embodiment, this embodiment is a description of the implementation of step S130. In the implementation process, as shown in FIG. 4, according to some embodiments of the present disclosure, the partially etching the hard mask layer through an etching gas, to form a plurality of first openings in the hard mask layer includes the following steps:

Step S131: Etch the second material layer through a second gas, to form a plurality of initial openings in the second material layer.

Referring to FIG. 11, a photoresist layer 160 is formed on the top surface of the second material layer 132, and the photoresist layer 160 is patterned to form photoresist patterns 160a on the photoresist layer 160, where the photoresist patterns 160a expose the top surface of part of the second material layer 132.

Figure 12:
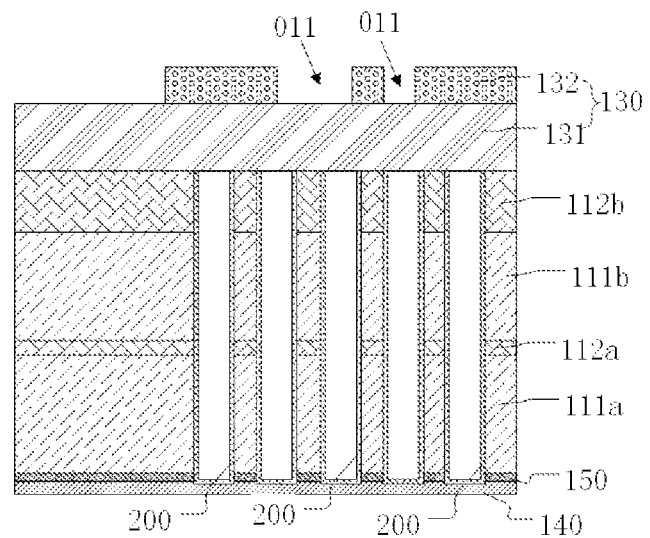
FIG. 12 is a schematic diagram of forming initial openings according to an exemplary embodiment.

This embodiment is described by using the cup-type capacitor as an example. As shown in FIG. 12 with reference to FIG. 11, the second material layer 132 is etched according to the photoresist layer 160, to form a plurality of initial openings 011 in the second material layer 132, where the plurality of initial openings 011 expose the top surface of the first material layer 131 and transfer the photoresist patterns 160a to the second material layer 132. In this embodiment, the etching gas for etching the second material layer 132 is the second gas, which may include second gas a fluorine-containing gas or a bromine-containing gas. For example, the second gas may be fluorine ($F_2$), bromine ($Br_2$), nitrogen trifluoride ($NF_3$), or the like.

Step S132: Etch the first material layer exposed by the plurality of initial openings through the first gas, until reaching the top surface of the laminated structure, to form the plurality of first openings.

Figure 14:
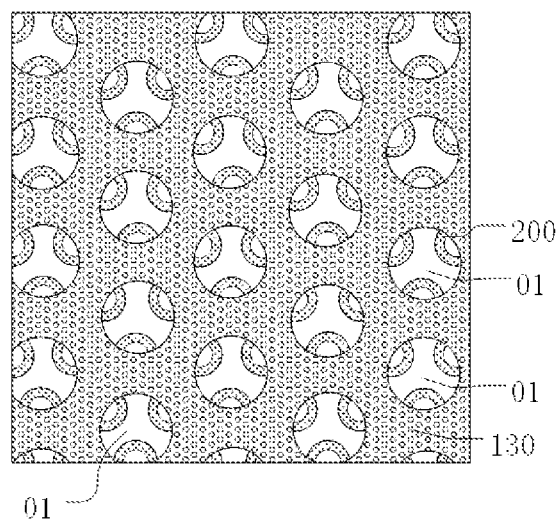
FIG. 14 is a top view of FIG. 13.

As shown in FIG. 13 and FIG. 14 with reference to FIG. 12, the first material layer 131 exposed by the initial openings 011 is etched through the first gas, where the top surface of the laminated structure 110 is used as an etching stop layer, to transfer the patterns of the initial openings 011 to the first material layer 131, thereby forming the first openings 01 in the hard mask layer 130. That is, the first openings 01 are formed based on the initial openings 011, where the first openings 01 include the initial openings 011.

In this embodiment, when the first gas etches the first material layer, the second material layer will not react with the plasma generated from the first gas through ionization. The size of the initial opening will not be increased during etching of the first material layer, ensuring the uniformity of the sizes of the formed first openings, such that the first openings has higher size accuracy.

Figure 5:
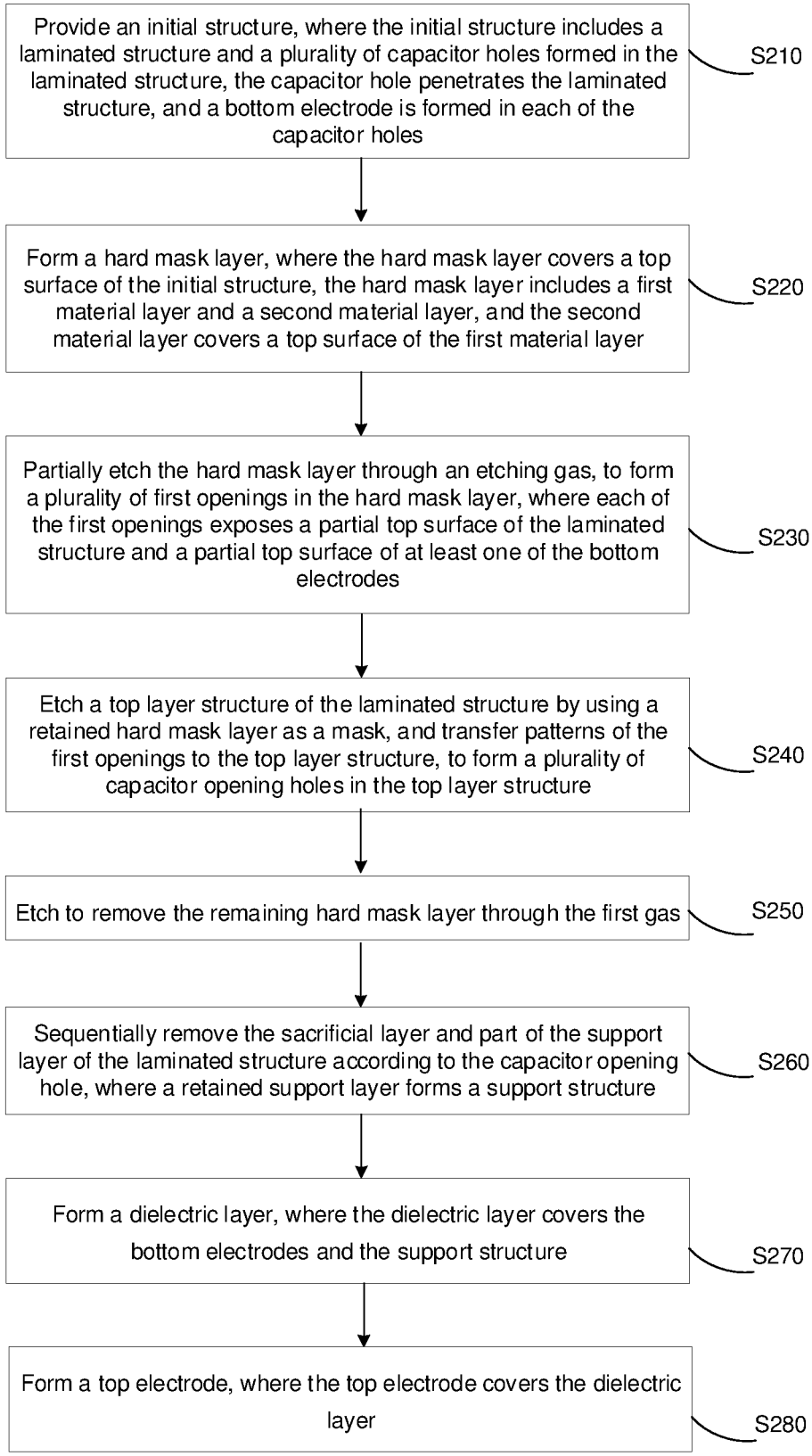
FIG. 5 is a flowchart of a method of manufacturing a semiconductor structure according to an exemplary embodiment.

As shown in FIG. 5, an exemplary embodiment of the present disclosure provides a method of manufacturing a semiconductor structure, including the following steps:

Step S210: Provide an initial structure, where the initial structure includes a laminated structure and a plurality of capacitor holes formed in the laminated structure, the capacitor hole penetrates the laminated structure, and a bottom electrode is formed in each of the capacitor holes.

The initial structure 100 includes a substrate 140, a laminated structure 110 provided on the substrate 140, and a plurality of capacitor holes 120 in the laminated structure 110, where each of the capacitor holes 120 is filled with a bottom electrode 200.

The bottom electrode 200 is taken as an example to describe this embodiment. As shown in FIG. 9, in this embodiment, the laminated structure 110 a first sacrificial layer 111a, a first support layer 112a, a second sacrificial layer 111b, and a second support layer 112b that are sequentially laminated on the substrate 140.

Step S220: Form a hard mask layer, where the hard mask layer covers a top surface of the initial structure, the hard mask layer includes a first material layer and a second material layer, and the second material layer covers a top surface of the first material layer.

Step S220 of this embodiment is implemented in the same manner as step S120 of the foregoing embodiment, and will not be described in detail again herein.

Step S230: Partially etch the hard mask layer through an etching gas, to form a plurality of first openings in the hard mask layer, where each of the first openings exposes a partial top surface of the laminated structure and a partial top surface of at least one of the bottom electrodes.

Figure 10:
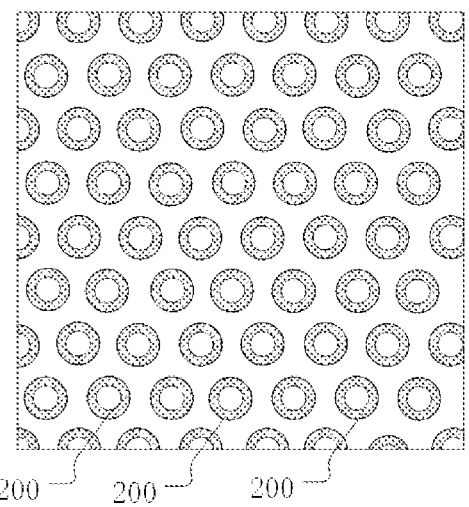
FIG. 10 is a top view of FIG. 9.

As shown in FIG. 14 with reference to FIG. 10, projection of each first opening 01 on the substrate 140 partially overlaps with projection of one capacitor hole 120 on the substrate 140, or projection of each first opening 01 on the substrate 140 partially overlaps with projection of some of the capacitor holes 120 on the substrate 140.

As shown in FIG. 14 with reference to FIG. 10, when projection of each first opening 01 on the substrate 140 partially overlaps with projection of one capacitor hole 120 on the substrate 140, and overlapping area is 30% to 60% of a total projection area of the capacitor hole 120 on the substrate 140.

As shown in FIG. 14 with reference to FIG. 10, projection of each first opening 01 on the substrate 140 partially overlaps with projection of some of the capacitor holes 120 on the substrate 140, the capacitor holes 120 are divided into a plurality of groups, and each group includes a plurality of adjacent capacitor holes 120. The projection of each first opening 01 on the substrate 140 partially overlaps with projection of the capacitor holes 120 in one group on the substrate 140, and an overlapping area of the projection of each capacitor hole 120 is 20% to 50% of a total projection area of the capacitor hole 120. For example, one group of capacitor holes may include two capacitor holes 120, four capacitor holes 120, six capacitor holes 120, eight capacitor holes 120 or other numbers of capacitor holes 120.

When the projection of each capacitor hole 120 on the substrate 140 has a larger overlapping area with the projection of the first opening 01 on the substrate 140, a larger area of the bottom electrode 200 in the capacitor hole 120 is exposed by the first opening 01, and in the subsequent process of etching the laminated structure 110, the bottom electrode 200 has a higher risk of being damaged. However, if an overlapping area is excessively small, a process window for etching the laminated structure 110 subsequently will be too small. Therefore, in this embodiment, each group includes three to five capacitor holes 120. The projection of each first opening 01 on the substrate 140 partially overlaps with projection of the three to five capacitor holes 120 in each group on the substrate 140. In this way, a small area of each bottom electrode 200 is exposed by the first opening 01, which reduces the damage on the bottom electrode 200 in subsequent etching of the laminated structure 110, and ensures that the first opening 01 can provide a large enough process window for subsequently etching the laminated structure 110, thereby ensuring the subsequent process to be smooth.

Step S240: Etch a top layer structure of the laminated structure by using a retained hard mask layer as a mask, and transfer patterns of the first openings to the top layer structure, to form a plurality of capacitor opening holes in the top layer structure.

Figure 15:
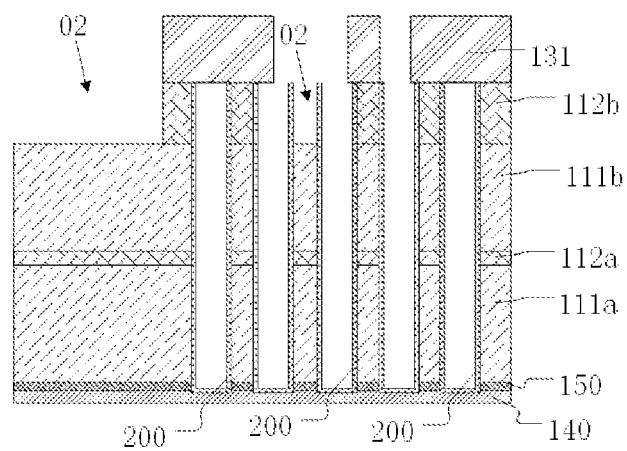
FIG. 15 is a schematic diagram of forming capacitor opening holes according to an exemplary embodiment.

As shown in FIG. 15 with reference to FIG. 13, by using the hard mask layer 130 as a mask, the second support layer 112b of the laminated structure 110 is etched by using a dry method, to transfer the patterns of the first openings 01 to the second support layer 112b, thereby forming the capacitor opening holes 02. The capacitor opening holes 02 expose the top surface of part of the second sacrificial layer 111b.

It should be noted that, a top layer structure of the laminated structure 110 is the support layer 112.

In this embodiment, the first material layer 131 is provided on the top surface of the laminated structure 110, and the first material layer 131 is etched through the first gas, such that no etching product reacting with the material of the bottom electrode 200 will be generated in the process of etching the first material layer 131, to prevent the etching product from reacting the material of the bottom electrode 200 to damage the bottom electrode 200, thereby ensuring high charge storage capacity of the capacitor structure.

Step S250: Etch to remove the remaining hard mask layer through the first gas.

Figure 16:
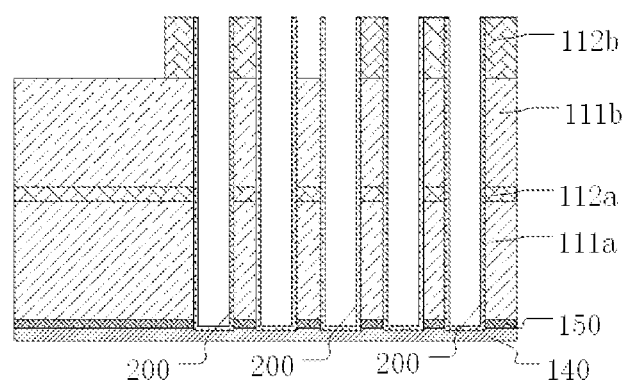
FIG. 16 is a schematic diagram of removing the remaining hard mask layer according to an exemplary embodiment.

As shown in FIG. 16 with reference to FIG. 15, the first gas may include a nitrogen-hydrogen gas. In this embodiment, the first gas may include one or both of $NH_3$ or $N_2H_2$. The etching product after the first gas completely removes the hard mask layer 130 is a nitrogen-containing or hydrogen-containing volatile substance, and the etching product will not react with the material of the bottom electrode 200.

Step S260: Sequentially remove the sacrificial layer and part of the support layer of the laminated structure according to the capacitor opening hole, where a retained support layer forms a support structure.

Figure 17:
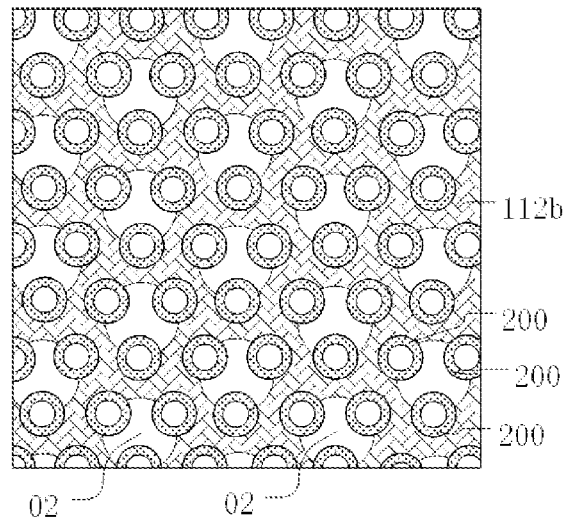
FIG. 17 is a top view of FIG. 16.
Figure 18:
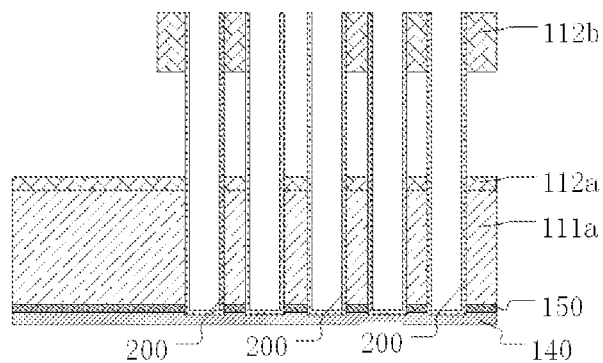
FIG. 18 is a schematic diagram of removing a second sacrificial layer according to an exemplary embodiment.
Figure 19:
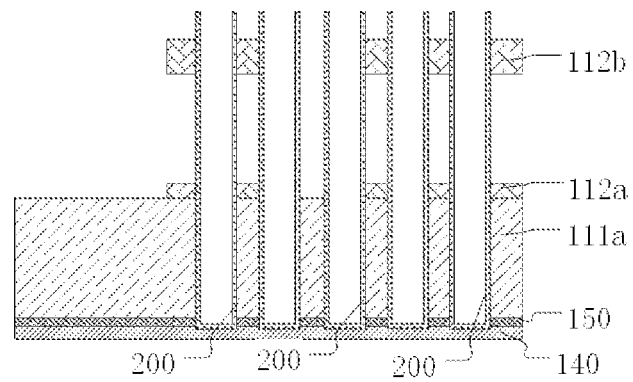
FIG. 19 is a schematic diagram of removing a first support layer according to an exemplary embodiment.
Figure 20:
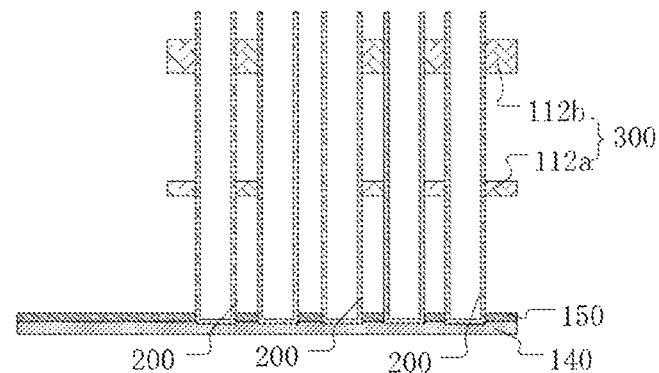
FIG. 20 is a schematic diagram of removing a first sacrificial layer according to an exemplary embodiment.

During execution of this step, as shown in FIG. 16 and FIG. 17, the capacitor opening holes 02 expose part of the second sacrificial layer 111b. As shown in FIG. 18 with reference to FIG. 16, an acid solution is injected into the capacitor opening hole 02, to dissolve the second sacrificial layer 111b in the acid solution, so as to completely remove the second sacrificial layer 111b to expose the first support layer 112a. As shown in FIG. 19 with reference to FIG. 18, the first support layer 112a is etched through a dry method, to transfer the patterns of the capacitor opening holes 02 to the first support layer 112a, thereby exposing the first sacrificial layer 111a. As shown in FIG. 20 with reference to FIG. 19, an acid solution is injected into the first sacrificial layer 111a through the capacitor opening holes 02, to completely remove the first sacrificial layer 111a by using the acid solution.

Referring to FIG. 20, the retained first support layer 112a and second support layer 112b form the support structure 300, and part of the side wall of the bottom electrode 200 is covered by the support structure 300. In this embodiment, part of the side wall of each bottom electrode 2 in each group of capacitor holes is covered by the support structure 300, and the support structure 300 connects a plurality of bottom electrodes 200 to form a whole, which reduces the tipping risk of the bottom electrode 200 due to an excessively large height-to-width ratio of the bottom electrode 200.

Step S270: Form a dielectric layer, where the dielectric layer covers the bottom electrodes and the support structure.

Figure 21:
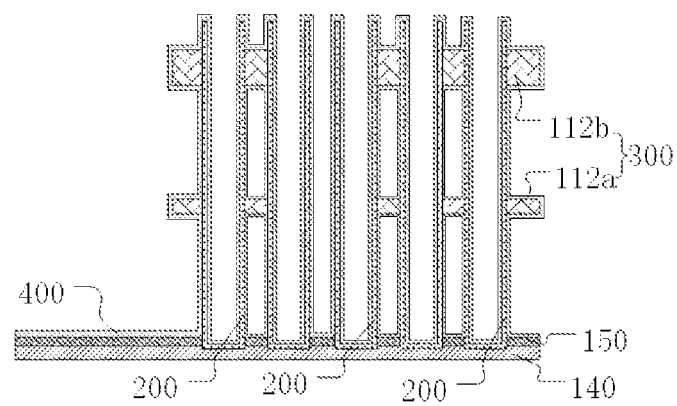
FIG. 21 is a schematic diagram of forming a dielectric layer according to an exemplary embodiment.

As shown in FIG. 21 with reference to FIG. 20, the dielectric layer 400 may be formed through atomic layer deposition (ALD). The dielectric layer 400 is made of a high-k material, which has a dielectric constant greater than that of silicon dioxide. The dielectric layer 400 covers the exposed side wall of the bottom electrode 200 and the support structure 300.

In this embodiment, the material of the dielectric layer 400 may include a compound containing one or more of the following components: rare earth elements, Hf, Rh, Ba and Al. The material of the dielectric layer 400 may be hafnium oxide, titanium nitride, titanium dioxide, aluminum oxide, lanthanum oxide, etc.

Step S280: Form a top electrode, where the top electrode covers the dielectric layer.

Figure 22:
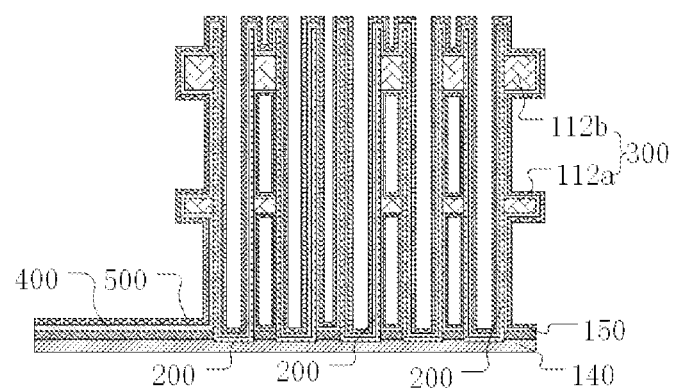
FIG. 22 is a schematic diagram of forming a top electrode according to an exemplary embodiment.

As shown in FIG. 22 with reference to FIG. 21, the top electrode 500 may be deposited with the ALD. The top electrode 500 is made of a material including a compound formed from one or both of a metal nitride and a metal silicide. In this embodiment, the material of the top electrode 500 may include one or two of titanium nitride, titanium silicide, titanium silicide, and $TiSi_xN_y$.

Figure 23:
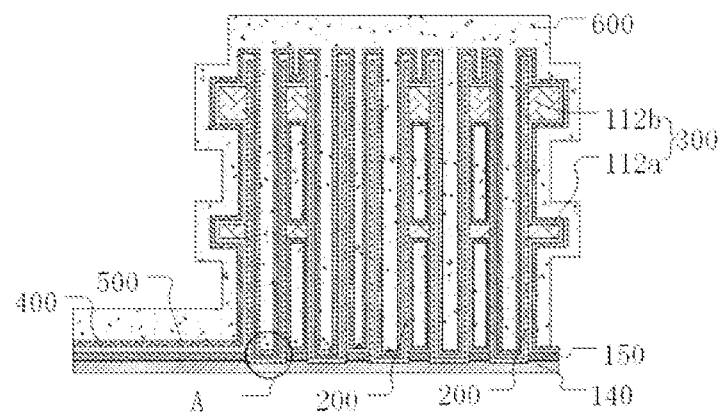
FIG. 23 is a schematic diagram of a formed semiconductor structure according to an exemplary embodiment.
Figure 24:
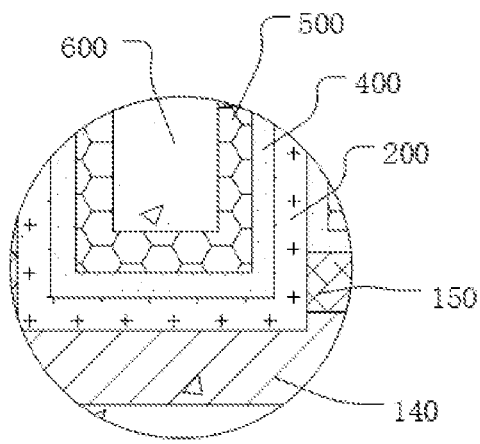
FIG. 24 is a partial enlarged view of position A in FIG. 23.

As shown in FIG. 23 and FIG. 24 with reference to FIG. 22, in this embodiment, after the top electrode 500 is formed, gaps in the top electrode 500 are filled with a deposited conductive material, to form a gap filling structure 600, where the gap filling structure 600 is made of a material including a silicon-germanium compound.

In the method of manufacturing this embodiment, in the process of etching the first support layer, part of the second support layer is removed through etching. As a result, the top surface of the retained second support layer is lower than the top surface of the bottom electrode. In the semiconductor structure formed in this embodiment, the support structure can expose a larger part of the bottom electrode, which increases the contact area of the bottom electrode, such that the formed capacitor structure has better electrical performance.

Figure 6:
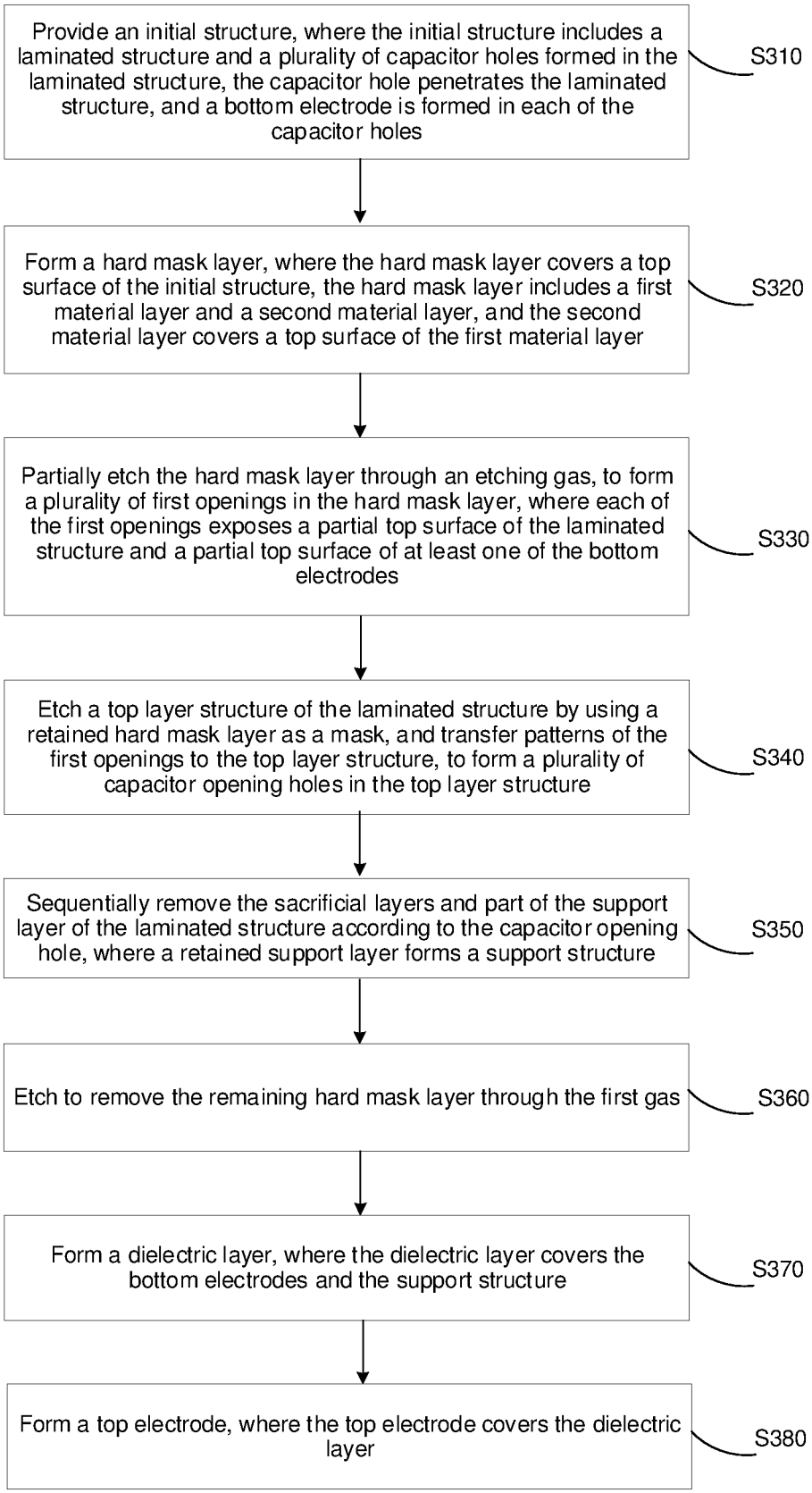
FIG. 6 is a flowchart of a method of manufacturing a semiconductor structure according to an exemplary embodiment.

As shown in FIG. 6, an exemplary embodiment of the present disclosure provides a method of manufacturing a semiconductor structure, including the following steps:

Step S310: Provide an initial structure, where the initial structure includes a laminated structure and a plurality of capacitor holes formed in the laminated structure, the capacitor hole penetrates the laminated structure, and a bottom electrode is formed in each of the capacitor holes.

Step S320: Form a hard mask layer, where the hard mask layer covers a top surface of the initial structure, the hard mask layer includes a first material layer and a second material layer, and the second material layer covers a top surface of the first material layer.

Step S330: Partially etch the hard mask layer through an etching gas, to form a plurality of first openings in the hard mask layer, where each of the first openings exposes a partial top surface of the laminated structure and a partial top surface of at least one of the bottom electrodes.

Step S340: Etch a top layer structure of the laminated structure by using a retained hard mask layer as a mask, and transfer patterns of the first openings to the top layer structure, to form a plurality of capacitor opening holes in the top layer structure.

In this embodiment, steps S310 to S340 of this embodiment are implemented in the same manner as steps S210 to S240 of the foregoing embodiment, and will not be described in detail again herein.

Step S350: Sequentially remove the sacrificial layer and part of the support layer of the laminated structure according to the capacitor opening hole, where a retained support layer forms a support structure.

Figure 25:
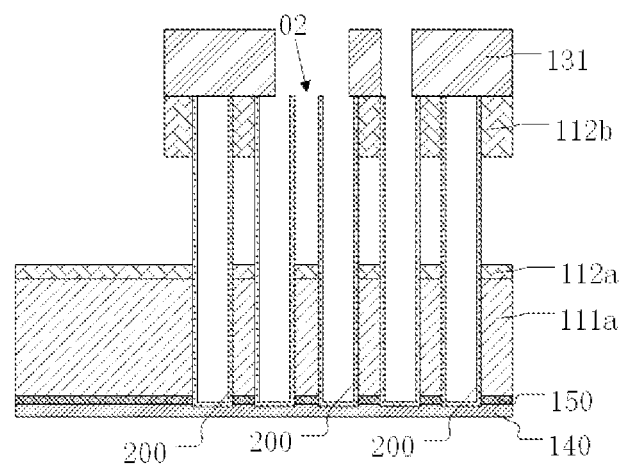
FIG. 25 is a schematic diagram of removing a second sacrificial layer according to an exemplary embodiment.
Figure 26:
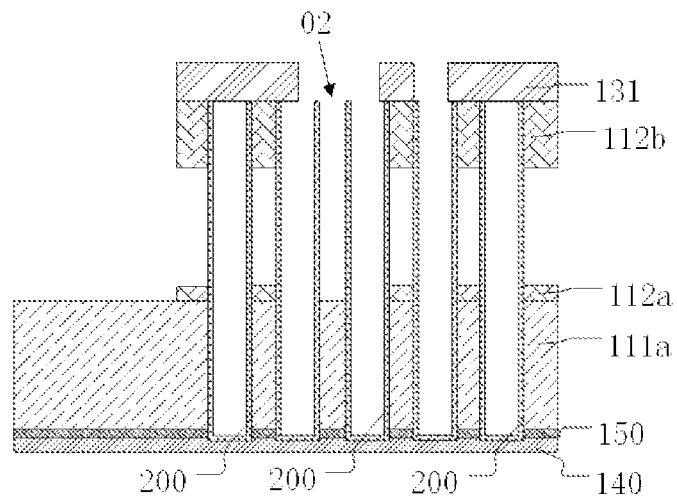
FIG. 26 is a schematic diagram of removing a first support layer according to an exemplary embodiment.
Figure 27:
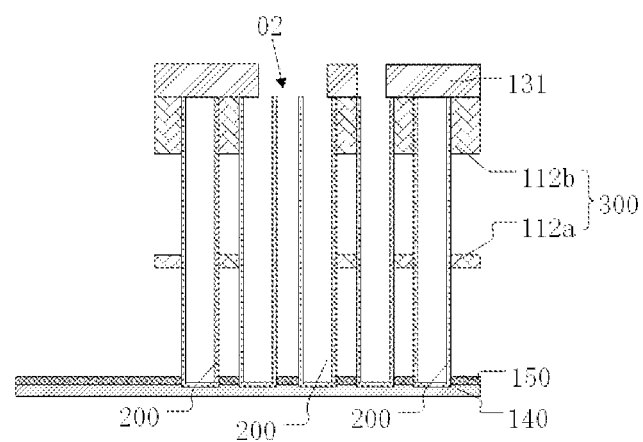
FIG. 27 is a schematic diagram of removing a first sacrificial layer according to an exemplary embodiment.

This embodiment differs from the foregoing embodiment in that, as shown in FIG. 25, FIG. 26, and FIG. 27, the first sacrificial layer 111a, the first support layer 112a, and the second sacrificial layer 111b are etched by using the retained hard mask layer 130 as an etching buffer layer in this embodiment, to avoid damaging the second support layer 112b at the top of the laminated structure 110 during removal of the first sacrificial layer 111a, the first support layer 112a or the second sacrificial layer 111b of the laminated structure 110. In other words, in this embodiment, the hard mask layer 130 is removed after the support structure is formed.

Step S360: Etch to remove the remaining hard mask layer through the first gas.

Figure 28:
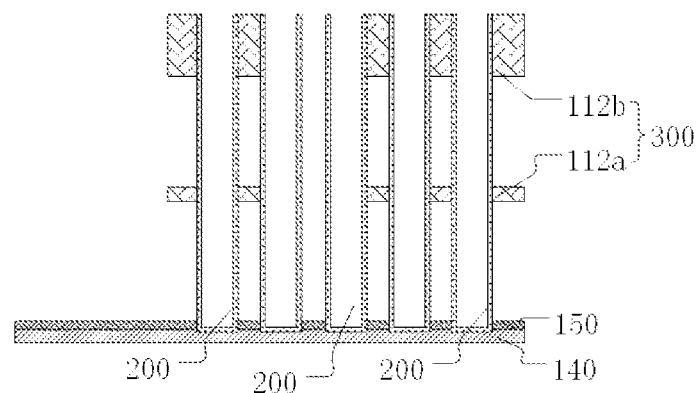
FIG. 28 is a schematic diagram of removing the remaining hard mask layer according to an exemplary embodiment.

In this embodiment, as shown in FIG. 28 with reference to FIG. 27, after the first sacrificial layer 111a, the first support layer 112a, and the second sacrificial layer 111b in the laminated structure 110 are removed, if the hard mask layer 130 still partially remains on the top surfaces of the support structure 300 and the bottom electrode 200, the remaining hard mask layer 130 is removed through etching with the first gas, to expose the entire top surface of the bottom electrode 200 and the entire top surface of the support structure 300, to facilitate the subsequent process of forming the capacitor structure.

Step S370: Form a dielectric layer, where the dielectric layer covers the bottom electrodes and the support structure.

Step S380: Form a top electrode, where the top electrode covers the dielectric layer.

In this embodiment, steps S370 to S380 of this embodiment are implemented in the same manner as steps S270 to S280 of the foregoing embodiment, and will not be described in detail again herein.

Figure 29:
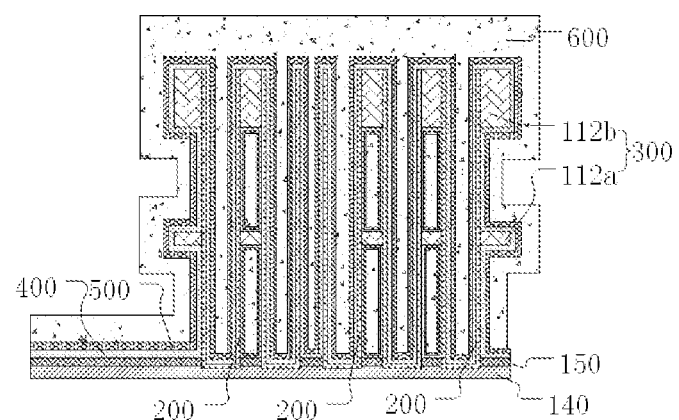
FIG. 29 is a schematic diagram of a formed semiconductor structure according to an exemplary embodiment.

In the semiconductor structure of this embodiment, as shown in FIG. 29, the top surface of the retained second support layer is flush with the top surface of the bottom electrode. That is, the support structure formed in this embodiment has a larger contact area with the top of the bottom electrode. The support structure can provide more powerful support for the top of the bottom electrode, and achieves a better effect of preventing the bottom electrode from tipping. The method of manufacturing this embodiment is applicable to the process of forming a capacitor structure with a higher height-to-width ratio.

An exemplary embodiment of the present disclosure provides a semiconductor structure. The semiconductor structure is manufactured by using the foregoing method of manufacturing a semiconductor structure. As shown in FIG. 23 or FIG. 29, the semiconductor structure of this embodiment is provided on a substrate 140, and the semiconductor structure includes: bottom electrodes 200, a support structure 300, a dielectric layer 400, and a top electrode 500. The support structure 300 includes a first support layer 112a and a second support layer 112b. The first support layer 112a covers part of a side wall in a middle of the bottom electrode 200, and the second support layer 112b covers part of the side wall at a top of the bottom electrode 200. A top surface of the second support layer 112b is flush with a top surface of the bottom electrode 200, or is higher or lower than the top surface of the bottom electrode 200. The dielectric layer 400 covers the bottom electrodes 200 and the support structure 300, and the top electrode 500 covers the dielectric layer 400.

According to an exemplary embodiment, as shown in FIG. 23 or FIG. 29, the semiconductor structure of this embodiment further includes a gap filling structure 600 with which gaps in the top electrode 500 are filled. In the semiconductor structure of this embodiment, the bottom electrode has an intact structure, and the capacitor structure has higher charge storage capacity.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of manufacturing a semiconductor structure, comprising:
providing an initial structure, wherein the initial structure comprises a laminated structure and a plurality of capacitor holes formed in the laminated structure, the capacitor hole penetrates the laminated structure, and a bottom electrode is formed in each of the capacitor holes;
forming a hard mask layer, wherein the hard mask layer covers a top surface of the initial structure; and
partially etching the hard mask layer through an etching gas, to form a plurality of first openings in the hard mask layer, wherein each of the first openings exposes a partial top surface of the laminated structure and a partial top surface of at least one of the bottom electrodes;
wherein the etching gas comprises a first gas, and the first gas comprises at least one of a nitrogen atomic-containing gas or a hydrogen atomic-containing gas, to avoid a combination reaction between the first gas and a material of the bottom electrode;
etching a top layer structure of the laminated structure by using a retained hard mask layer as a mask, and transferring patterns of the first openings to the top layer structure, to form a plurality of capacitor opening holes in the top layer structure;
etching to remove the remaining hard mask layer through the first gas.

2. The method of manufacturing the semiconductor structure according to claim 1, wherein the first gas comprises a nitrogen-hydrogen gas.

3. The method of manufacturing the semiconductor structure according to claim 2, wherein the first gas comprises one or more of $NH_3$ and $N_2H_2$.

4. The method of manufacturing the semiconductor structure according to claim 1, wherein the forming a hard mask layer comprises:
depositing a first material, wherein the first material covers the top surface of the initial structure to form a first material layer;
depositing a second material, wherein the second material covers a top surface of the first material layer to form a second material layer; and
reacting, under a discharge condition, the first material with plasma generated from the first gas through ionization, to generate a volatile substance, wherein the first material has a higher etching selectivity relative to the second material.

5. The method of manufacturing the semiconductor structure according to claim 4, wherein the partially etching the hard mask layer through an etching gas comprises:
etching the second material layer through a second gas, to form a plurality of initial openings in the second material layer; and etching the first material layer exposed by the plurality of initial openings through the first gas, until reaching a top surface of the laminated structure, to form the plurality of first openings.

6. The method of manufacturing the semiconductor structure according to claim 1, wherein
the laminated structure comprises a sacrificial layer and a support layer that are laminated alternately; and the method of manufacturing the semiconductor structure further comprises:
sequentially removing the sacrificial layer and part of the support layer of the laminated structure according to the capacitor opening hole, wherein a retained support layer forms a support structure.

7. The method of manufacturing the semiconductor structure according to claim 6, further comprising:
forming a dielectric layer, wherein the dielectric layer covers the bottom electrode and the support structure; and
forming a top electrode, wherein the top electrode covers the dielectric layer.

8. The method of manufacturing the semiconductor structure according to claim 1, wherein the providing an initial structure comprises:
providing a substrate, and forming a sacrificial layer and a support layer alternately on the substrate, to form an initial laminated structure, wherein the support layer is taken as a top layer structure of the initial laminated structure;
forming a first mask layer on a top surface of the initial laminated structure;
etching the initial laminated structure according to the first mask layer to form the plurality of capacitor holes in the initial laminated structure, wherein along a lamination direction of the initial laminated structure, the capacitor hole penetrates the initial laminated structure and exposes part of the substrate; and
forming the bottom electrode in each of the capacitor holes.

9. The method of manufacturing the semiconductor structure according to claim 8, wherein projection of each of the first openings on the substrate partially overlaps with projection of one capacitor hole on the substrate, or projection of each of the first openings on the substrate partially overlaps with projection of some of the plurality of capacitor holes on the substrate.

10. The method of manufacturing the semiconductor structure according to claim 9, wherein the projection of each of the first openings on the substrate partially overlaps with projection of three to five capacitor holes on the substrate.

11. The method of manufacturing the semiconductor structure according to claim 8, wherein the forming the bottom electrode in each of the capacitor holes comprises:
depositing an electrode material, wherein the electrode material covers a side wall and a bottom surface of the capacitor hole to form the bottom electrode.

12. The method of manufacturing the semiconductor structure according to claim 8, wherein the forming the bottom electrode in each of the capacitor holes comprises:
depositing an electrode material, wherein the capacitor hole is filled with the electrode material to form the bottom electrode.

13. A semiconductor structure, wherein the semiconductor structure is manufactured by the method of manufacturing the semiconductor structure according to claim 1.

* * * * *